United States Patent [19]
Harder et al.

[11] Patent Number: 5,301,202
[45] Date of Patent: Apr. 5, 1994

[54] SEMICONDUCTOR RIDGE WAVEGUIDE LASER WITH ASYMMETRICAL CLADDING

[75] Inventors: Christoph S. Harder, Zurich, Switzerland; Sridhar V. Iyer, Beacon, N.Y.; Heinz P. Meier, Thalwil, Switzerland; Alfred Phillips, Jr.; Abbas Behfar-Rad, both of Wappingers Falls, N.Y.

[73] Assignee: International Business Machines, Corporation, Armonk, N.Y.

[21] Appl. No.: 22,212

[22] Filed: Feb. 25, 1993

[51] Int. Cl.$^5$ ............................................. H01S 3/19
[52] U.S. Cl. ........................................ 372/46; 372/45
[58] Field of Search ............................ 372/46, 45, 43

[56] References Cited

U.S. PATENT DOCUMENTS

| | | | |
|---|---|---|---|
| 4,383,319 | 5/1983 | Shimizu et al. | 372/45 |
| 4,615,032 | 9/1986 | Holbrook et al. | 372/45 |
| 4,719,632 | 1/1988 | Lindsey et al. | 372/50 |
| 4,731,789 | 3/1988 | Thornton | 372/45 |
| 4,821,278 | 4/1989 | Yang et al. | 372/46 |
| 4,959,839 | 9/1990 | Yamamoto | 372/46 |
| 4,980,893 | 12/1990 | Thornton et al. | 372/50 |
| 4,980,895 | 12/1990 | Nishimura | 372/96 |
| 5,034,957 | 7/1991 | Ohba et al. | 372/45 |
| 5,038,185 | 8/1991 | Thornton | 357/17 |
| 5,189,679 | 2/1993 | Derry et al. | 372/45 |

FOREIGN PATENT DOCUMENTS

| | | | |
|---|---|---|---|
| 0096289 | 4/1991 | Japan | 372/46 |
| 0136388 | 6/1991 | Japan | 372/46 |
| 0010689 | 1/1992 | Japan | 372/46 |
| 0111375 | 4/1992 | Japan | 372/46 |
| 0340284 | 11/1992 | Japan | 372/46 |

OTHER PUBLICATIONS

High Power Ridge-Waveguide AlGaAs GRIN-SCH Laser Diode, Harder et al., Electronic Letters, Sep. 25 1986, vol. 22, No. 20, pp. 1081-1082.

*Primary Examiner*—Georgia Y. Epps
*Attorney, Agent, or Firm*—Perman & Green

[57] ABSTRACT

A semiconductor ridge waveguide laser having a high value of horizontal far-field wherein the laser structure includes a substrate, a first or lower cladding layer composed of a AlGaAs on the substrate, an acting layer on the lower cladding layer, and a second or upper cladding layer composed of AlGaAs on the active layer. The upper cladding layer includes a raised ridge portion formed by etching the upper cladding layer through a mask. A contact layer is disposed on top of the ridge portion. The aluminum mole concentration of the lower cladding layer is greater than the aluminum mole concentration of the upper cladding layer. This forces the optical mode towards the upper cladding layer and results in an increased lateral waveguide confinement that produces a high horizontal far-field.

6 Claims, 3 Drawing Sheets

SEMICONDUCTOR RIDGE WAVEGUIDE LASER WITH ASYMMETRICAL CLADDING

FIELD OF THE INVENTION

The present invention relates to semiconductor ridge waveguide laser structures, and more particularly to the adjustment of the horizontal far-field values of a semiconductor ridge waveguide laser structure by adjusting the structural composition of the laser layers.

BACKGROUND OF THE INVENTION

In the design of semiconductor ridge waveguide lasers, it is desirable to adjust and control the resultant horizontal far-field parameter. In state-of-the-art processes used for fabricating semiconductor ridge waveform lasers, design control of the horizontal far-field (HFF) is accomplished using the residual ridge etch parameter and the ridge width parameter. A small value of residual ridge etch can result in high HFF but can also lead to reliability concerns. Too small a ridge width can lead to high contact resistance or loss of contact layer in ridges formed through wet etching.

SUMMARY OF THE INVENTION

The present invention provides a technique for controlling the horizontal far-field parameter of a semiconductor ridge-laser by varying the difference between the Al concentrations of the upper and lower AlGaAs cladding layers of the semiconductor laser vertical structure. This variation in the Al concentration difference is performed while all other parameters such as etch depth and ridge width are held constant.

The difference between the Al concentrations of the upper and lower AlGaAs cladding layers is varied by either decreasing the Al mole fraction of the upper cladding layer relative to the lower cladding layer or increasing the Al mole concentration of the lower layer with respect to the upper layer.

DESCRIPTION OF THE PREFERRED EMBODIMENTS

Figure 1:
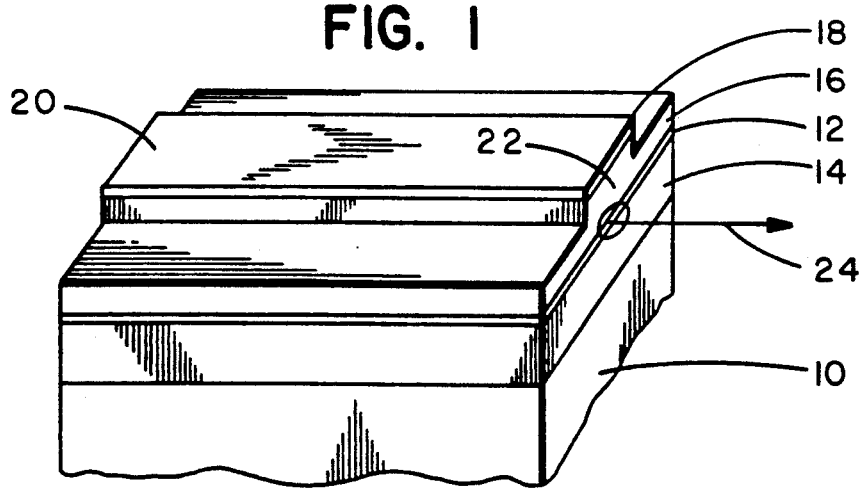
FIG. 1 is a schematic drawing of a semiconductor ridge waveguide laser illustrating the principles of the present invention.

Referring to FIG. 1, a semiconductor ridge waveguide laser is illustrated. The structure includes a substrate 10 and an active layer 12 disposed between cladding layers 14 and 16. The structure includes the waveguide ridge 20 which comprises a contact layer 18 and a ridge portion 22 of the upper cladding layer 16. Conventional insulation for the ridge sidewalls and upper cladding layer 16 and the typical metallization layers are not shown in FIG. 1 for clarity.

As in any ridge waveguide laser, when the device of FIG. 1 is activated by applying proper operating voltages, a light beam 24 is emitted from the light mode region of the laser indicated by the small elipse centering around the active region 12. In the embodiment of FIG. 1, the cladding layers 14 and 16 are composed of $Al_{0.39}Ga_{0.61}As$ and active layer 12 of a GaAp quantum cell sandwiched between two graded regions of AlGaAs. Contact layer 20 is composed of GaAs.

The structure of FIG. 1 is formed using techniques employed to fabricate prior art ridge waveguide lasers such as described in HIGH POWER RIDGE WAVEGUIDE AlGaAs GRIN-SCH LASER DIODE, Electronics Letters, Sep. 25, 1986, Vol. 22, No. 20, pages 1081-1082. Molecular beam epitaxy is used in the growth of the semiconductor laser crystal structure. The significant feature of the present invention is that the bottom and top cladding layers 14 and 16 of the laser of FIG. 1 have different aluminum mole fractions.

Figure 2:
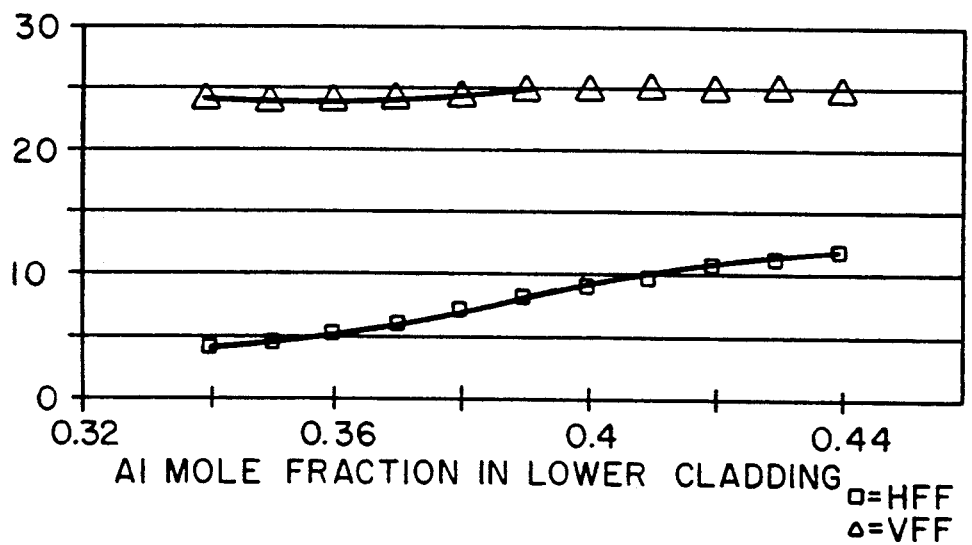
FIG. 2 is an illustration of the variation of the horizontal far-field and the vertical far-field angles as the aluminum mole fraction of the bottom cladding layer 14 of the laser of FIG. 1 is varied and the aluminum mole fraction of the top cladding layer 16 is kept constant.
Figure 3:
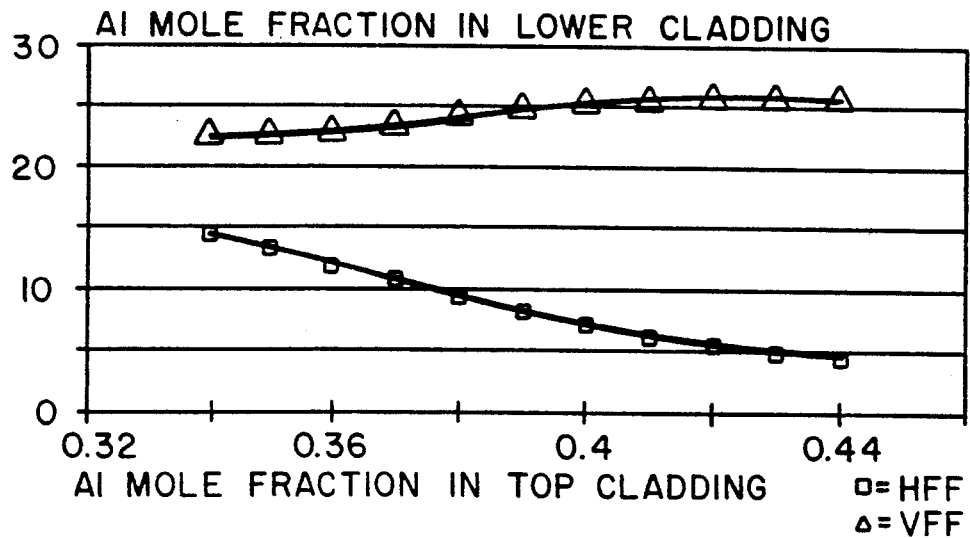
FIG. 3 is an illustration of the variation of the horizontal far-field and the vertical far-field angles as the aluminum mole fraction of the top cladding layer 16 of the laser of FIG. 1 is varied and the bottom cladding layer 14 is kept constant.
Figure 4:
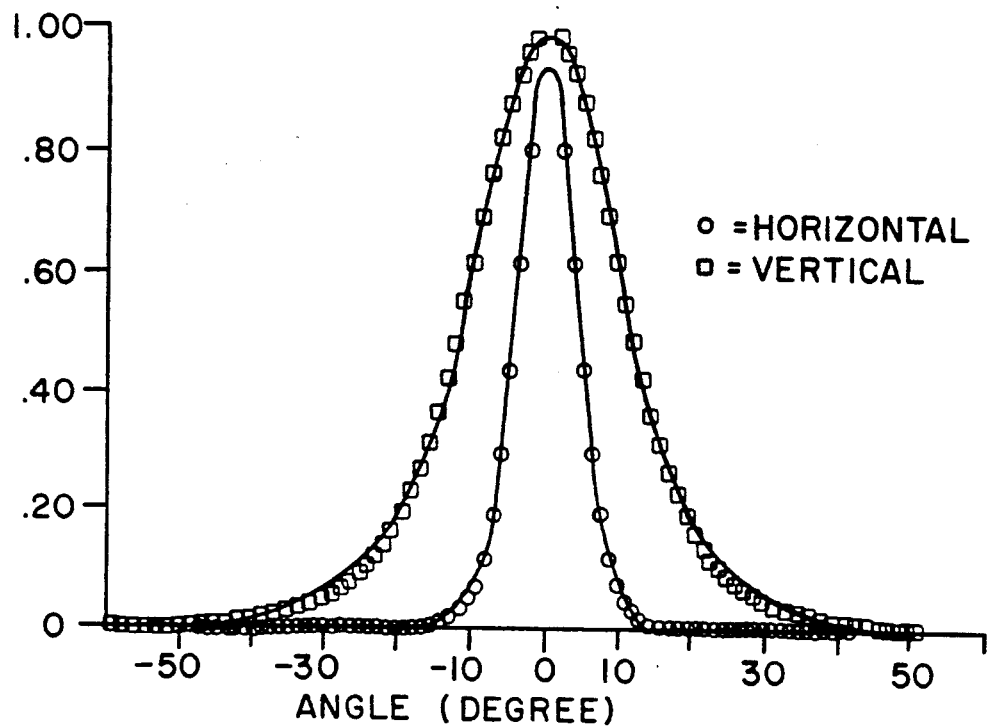
FIG. 4 is an illustration of the horizontal and vertical far-fields for a semiconductor ridge waveguide laser where there is symmetry in the Al concentrations of the upper and lower cladding layers.
Figure 5:
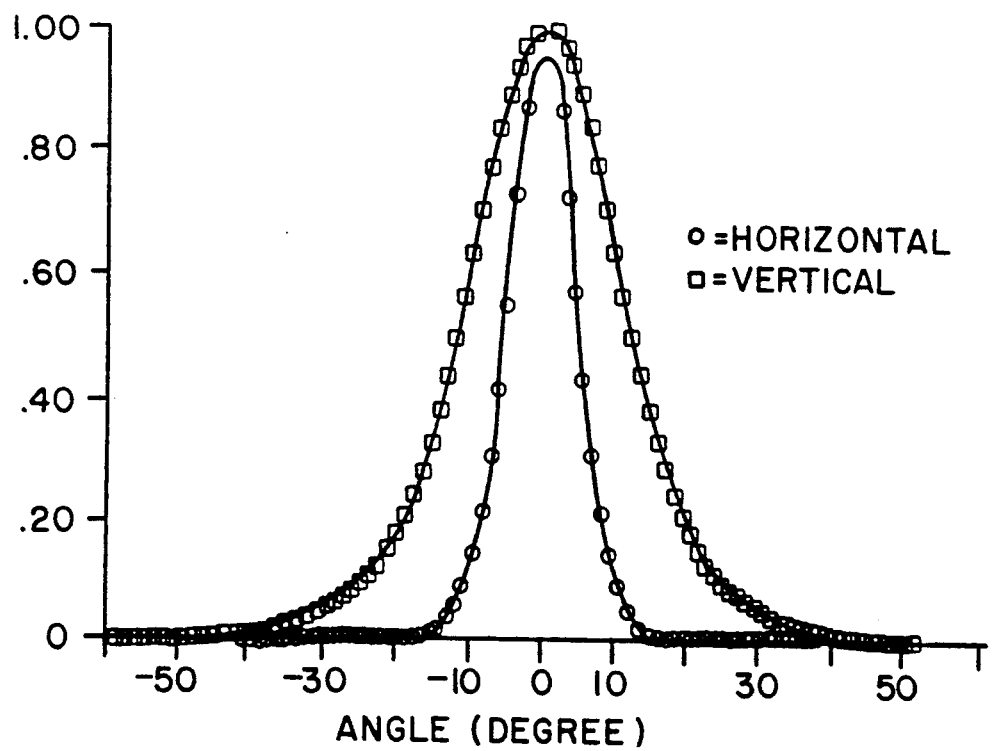
FIG. 5 is an illustration of the horizontal and vertical far-fields for a semiconductor ridge waveguide laser where there is asymmetry between the Al concentrations of the upper and lower cladding layers, with the Al concentration of the lower cladding layer being higher.

FIGS. 2 and 3 illustrate that different cladding layer aluminum mole fraction levels significantly change the horizontal (lateral) far field (HFF) providing a continuum of low to high HFF values. In FIG. 2 the top cladding layer (layer 16 of FIG. 1) was a constant Al mole fraction of 0.39 while the aluminum mole fraction of the bottom cladding layer 14 was varied from 0.34 to 0.4. In FIG. 3 the bottom cladding layer 14 was a constant 0.39 aluminum mole fraction while the Al mole fraction of the top cladding layer 16 was varied from 0.34 to 0.44. The effect of the HFF and vertical far-field (VFF) is illustrated by the curves of FIGS. 2 and 3.

It is known in the art that the optical confinement of a semiconductor laser structure is increased when the Al concentrations in the lower cladding layer is increased. Tighter optical confinement leads to higher vertical far-field and, as discussed in U.S. Pat. No. 5,038,185, the Al concentration in the lower cladding layer can be reduced to achieve low far-field divergence (or vertical far-field).

The present invention is directed to a semiconductor ridge waveguide laser wherein the Al concentration in the lower cladding layer is modified with respect to the upper cladding layer provides asymmetrical Al mole fractions in the two claddings which results in a difference in horizontal far-field performance.

A semiconductor ridge waveguide laser as shown in FIG. 1 includes a ridge 22 which is formed by an etching process. The etch depth, which determines the remaining upper cladding layer 16 thickness outside the ridge portion 22 and the ridge 22 width, is a significant factor in the horizontal far-field performance. The ridge etch, and the dielectric insulation deposited on the etched sections lower the index in the sections of layer 16 outside the ridge portion 22.

This means that the ridge portion 22 has a higher index with respect to the adjacent etched sections. A high index section surrounded by low index sections are the elements for optical confinement or waveguiding. The deeper the etch, the lower the index in the etched sections layer 16 adjacent to the ridge portion 22 will become. When the difference between the effective index of the ridge 22 and its adjacent section of layer 16 gets larger, the confinement laterally gets tighter and the horizontal far-field gets wider. The width of ridge portion 22 has an effect on horizontal far-field which is typically such as that illustrated in FIG. 6.

Figure 6:
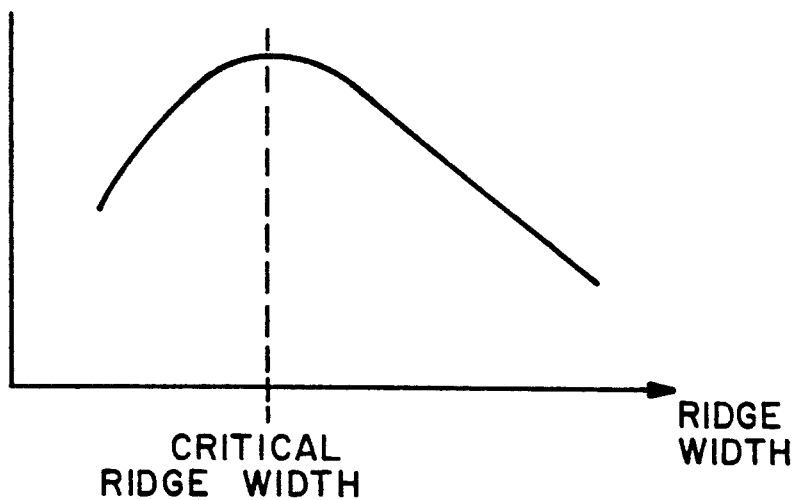
FIG. 6 is an illustration of the variation of the value of the horizontal far-field of a semiconductor ridge waveguide laser with respect to variations of the width of the optical ridge.

In the curve of FIG. 6, it is seen that as the ridge widths go from large to small, the horizontal far-field increases. This is due to the tighter or tighter confinement that occurs. However, as the width of the ridge portion decreases below a critical width, the horizontal far-field decreases as the ridge width is reduced. This occurs because the ridge is no longer large enough to contain the mode, and the optical field (or near-field) expands, resulting in lower horizontal far-field.

The factor of asymmetry of the Al concentration between the cladding layers, in combination with etch depth and width of the ridge portion, provides a significant effect on the horizontal far-field.

Generally, for structures formed by the wet-etch process, a ridge width that is larger than that of the critical ridge width of FIG. 6 is fabricated for practical purposes. Too small a ridge width causes the contact region (region 18 of FIG. 1) to be etched off. The thickness of the residual cladding in the regions of layer 16 outside the ridge portion 22 are determined by the ridge etch and are generally about 0.3 or 0.4 microns. Going below this value leads to process sensitivity and reliability difficulties.

The higher Al concentration level in the lower cladding layer versus the upper cladding layer according to the principles of the present invention results in the pushing up of the optical mode towards the upper portion of the structure. If all parameters other than the Al concentration difference are kept constant, the mode will "see" a greater lateral confinement and hence a larger horizontal far-field is obtained. This can be seen in the curves of FIG. 2 where the Al concentration of the top cladding layer 16, as well as all the other parameters, are kept constant, while the Al concentrations of lower cladding layer 14 is changed.

The horizontal far-field is seen to increase as the Al concentration of the lower cladding layer 14 increases.

What has been described is a semiconductor ridge waveguide laser structure wherein the horizontal far-field parameter of the semiconductor ridge-laser is changed by varying the difference between the Al concentrations of the upper and lower AlGaAs claddings of the semiconductor laser vertical structure. The variation in the Al concentration difference is performed while all other parameters such as etch depth and ridge width are held constant.

In the fabrication process for a semiconductor ridge waveguide laser, the etch which defines the ridge in the ridge laser causes lateral guiding by lowering the index in the regions adjacent to the ridge. In waveguides such as semiconductor lasers, the effect of lowering the Al concentration of the upper cladding layer with respect to the lower one is to cause more of the intensity of the mode to shift towards the upper cladding. In the ridge-laser described, this causes more of the mode to "see" a lower index region as introduced by the ridge etch. This leads to changes in the beam properties and hence the horizontal far-field.

Generally, it is desirable to avoid a deep etch and a small ridge-width. The reasons for this lies in reliability considerations when the regions adjacent to the ridge are etched too close to the laser active layer, and too small a ridge width may not be desirable for the series resistance. The described invention could, therefore, make it easier to provide a high horizontal far-field laser without having to etch too close to the active layer of the semiconductor laser and making the ridge width too small.

While the invention has been described in connection with a preferred embodiment, it is not intended to limit the scope of the invention to the particular form set forth, but, on the contrary, it is intended to cover such alternatives, modifications, and equivalence as may be included within the spirit and scope of the invention as defined in the appended claims.

We claim:

1. A semiconductor ridge waveguide laser structure comprising:

a semiconductor substrate;

a first, lower cladding layer disposed on said substrate;

an active layer disposed on said first cladding layer;

a second, upper cladding layer disposed on said active layer, said second cladding layer including a raised ridge section extending on said second cladding layer;

a contact layer disposed on said second cladding layer;

said raised ridge section of said second cladding layer being formed by selectively etching said contact layer and said second cladding layer with a mask to provide a ridge portion having a thickness greater than the etched, non-ridge portion of said second cladding layer, and wherein said ridge portion has a width for supporting said contact layer;

said first cladding layer being composed of AlGaAs and having a first mole concentration value of aluminum;

said second cladding layer being composed of AlGaAs and having a second mole concentration value of aluminum; and wherein said first lower cladding layer has an aluminum mole concentration greater than the aluminum mole concentration of said second, upper cladding layer.

2. A semiconductor ridge waveguide laser structure according to claim 1 wherein said semiconductor ridge waveguide laser produces a laser radiation beam characterized in having a horizontal far-field component, and wherein said width of said ridge portion, said thicknesses of said ridge portion and non-ridge portions of said second, upper cladding layer and said greater aluminum mole concentration of said first, lower cladding layer relative to said aluminum mole concentration of said second, upper cladding layer cooperate to provide a high value of said horizontal far-field.

3. A semiconductor ridge waveguide laser structure according to claim 2 wherein said etching of said ridge portion and non ridge portions of said second, upper cladding layer produces of difference in index between the index of said ridge portion and the index of said non ridge portion to provide lateral waveguide confinement which effects said horizontal far-field, wherein a larger difference in said index results in a larger horizontal far-field; and wherein said larger concentration of aluminum in said first, lower cladding layer compared to the aluminum concentration in said second, upper cladding layer raises the optical mode of said laser to increase said confinement and provide a larger horizontal field.

4. A semiconductor ridge waveguide laser structure according to claim 3 wherein said higher concentration of aluminum on said first, lower cladding layer forces said optical mode towards the direction of said second, upper cladding layer and the ridge.

5. A semiconductor ridge waveguide laser structure according to claim 4 wherein said aluminum mole concentration of said first, lower cladding layer has an Al mole fraction value of 0.44 and the aluminum mole concentration of said second, upper cladding layer has an Al mole fraction value of less than 0.44.

6. A semiconductor ridge waveguide laser structure according to claim 4 wherein said aluminum mole concentration of said first, lower cladding layer has a doping mole fraction value of 0.44 and the aluminum mole concentration of said second, upper cladding layer has a doping mole fraction value of less than 0.44.

* * * * *